(12) United States Patent  (10) Patent No.: US 7,504,592 B1
Crotty, Jr.  (45) Date of Patent: Mar. 17, 2009

(54) ELECTROMAGNETIC INTERFERENCE SHIELDS AND RELATED MANUFACTURING METHODS

(75) Inventor: Paul W. Crotty, Jr., East Stroudsburg, PA (US)

(73) Assignee: Laird Technologies, Inc., Chesterfield, MO (US)

( * ) Notice: Subject to any disclaimer, the term of this patent is extended or adjusted under 35 U.S.C. 154(b) by 54 days.

(21) Appl. No.: 11/848,923

(22) Filed: Aug. 31, 2007

(51) Int. Cl.
*H05K 9/00* (2006.01)

(52) U.S. Cl. ............... 174/372; 174/377; 174/382; 174/384; 361/816

(58) Field of Classification Search ............ 174/372, 174/377, 382, 384; 361/816, 818
See application file for complete search history.

(56) References Cited

U.S. PATENT DOCUMENTS

| | | | |
|---|---|---|---|
| 1,257,502 A | | 2/1918 | Leighton |
| 2,016,225 A | | 10/1935 | Bukolt |
| 4,754,101 A | | 6/1988 | Stickney et al. |
| 4,759,466 A | * | 7/1988 | Chase et al. ............... 220/4.02 |
| 5,014,160 A | * | 5/1991 | McCoy, Jr. ............... 361/818 |
| 5,095,177 A | * | 3/1992 | Johnson ............... 174/372 |
| 5,153,379 A | | 10/1992 | Guzuk et al. |
| 5,353,201 A | * | 10/1994 | Maeda ............... 361/816 |
| 5,354,951 A | | 10/1994 | Lange, Sr. et al. |
| 5,365,410 A | | 11/1994 | Lonka |
| 5,383,098 A | | 1/1995 | Ma et al. |
| 5,422,433 A | | 6/1995 | Rivera et al. |
| 5,436,802 A | | 7/1995 | Trahan et al. |
| 5,495,399 A | | 2/1996 | Gore et al. |
| 5,513,996 A | | 5/1996 | Annerino et al. |
| 5,530,202 A | | 6/1996 | Dais et al. |
| 5,566,055 A | | 10/1996 | Salvi, Jr. |
| 5,614,694 A | | 3/1997 | Gorenz, Jr. et al. |
| 5,844,784 A | | 12/1998 | Moran et al. |
| 5,886,879 A | | 3/1999 | Matuschik |
| 5,895,884 A | * | 4/1999 | Davidson ............... 174/372 |
| 5,917,710 A | | 6/1999 | Maatta |
| 5,991,165 A | | 11/1999 | Jones, Jr. et al. |
| 6,002,086 A | * | 12/1999 | Yajima ............... 174/373 |
| 6,005,186 A | | 12/1999 | Bachman |
| 6,043,983 A | | 3/2000 | Taylor et al. |
| 6,049,469 A | | 4/2000 | Hood, III et al. |
| 6,051,781 A | | 4/2000 | Bianca et al. |
| 6,110,563 A | | 8/2000 | Pienimaa et al. |
| 6,136,131 A | | 10/2000 | Sosnowski |

(Continued)

FOREIGN PATENT DOCUMENTS

FR 2733662 2/1996

(Continued)

*Primary Examiner*—Hung V Ngo
(74) *Attorney, Agent, or Firm*—Harness, Dickey & Pierce, P.L.C.

(57) ABSTRACT

According to various aspects, exemplary embodiments are provided of board level shields having single piece constructions. In an exemplary embodiment, a shielding enclosure includes sidewalls and an integral top surface. The sidewalls include upper and lower portions cooperatively defining an interlock therebetween. The upper sidewall portions depend downwardly from the integral top surface. The interlock releasably attaches the integral top surface and upper sidewall portions to the lower sidewall portions. By disengaging the interlock, the integral top surface and upper sidewall portions may then be completely separated from the lower sidewall portions. The integral top surface and upper sidewall portions may also be reattached to the lower sidewall portions by engagement of the interlock.

21 Claims, 12 Drawing Sheets

U.S. PATENT DOCUMENTS

| | | |
|---|---|---|
| D434,771 S | 12/2000 | Ohtani |
| 6,175,077 B1 | 1/2001 | Mendolia et al. |
| 6,178,097 B1 | 1/2001 | Hauk, Jr. |
| 6,265,658 B1 | 7/2001 | Silvers |
| 6,274,808 B1 | 8/2001 | Cercioglu et al. |
| 6,313,400 B1 | 11/2001 | Mosquera et al. |
| 6,377,472 B1 | 4/2002 | Fan |
| 6,384,324 B2 | 5/2002 | Flegeo |
| 6,385,054 B1 | 5/2002 | Vesamaki et al. |
| 6,501,016 B1 | 12/2002 | Sosnowski |
| 6,522,291 B1 | 2/2003 | Noguchi et al. |
| 6,628,524 B1 | 9/2003 | Washino et al. |
| D484,508 S | 12/2003 | Crippen et al. |
| 6,711,032 B2 | 3/2004 | Sommer |
| 6,717,799 B2 | 4/2004 | Hamano et al. |
| 6,738,265 B1 | 5/2004 | Svarfvar et al. |
| 6,743,975 B2 | 6/2004 | Kolb |
| 6,744,640 B2 | 6/2004 | Reis et al. |
| 6,763,576 B2 | 7/2004 | Watchko et al. |
| 6,781,847 B2 | 8/2004 | Jakob et al. |
| 6,781,851 B2 | 8/2004 | Daoud et al. |
| 6,784,363 B2 | 8/2004 | Jones |
| 6,787,696 B2 | 9/2004 | Liljevik et al. |
| 6,870,091 B2 | 3/2005 | Seidler |
| 6,897,371 B1 | 5/2005 | Kurz et al. |
| D522,517 S | 6/2006 | Latawiec et al. |
| 2002/0185294 A1 | 12/2002 | Shlyakhtichman et al. |
| 2003/0067757 A1 | 4/2003 | Richardson et al. |
| 2004/0012939 A1 | 1/2004 | Ta et al. |
| 2004/0084198 A1 | 5/2004 | Seidler |
| 2004/0211579 A1 | 10/2004 | Koivusilta |
| 2004/0240192 A1 | 12/2004 | Seidler |
| 2005/0068758 A1 | 3/2005 | Blersch |
| 2005/0121212 A1 | 6/2005 | English et al. |
| 2006/0292906 A1 | 12/2006 | Horng |
| 2007/0094977 A1 | 5/2007 | Zuehlsdorf |
| 2007/0121309 A1 | 5/2007 | Long et al. |

FOREIGN PATENT DOCUMENTS

| | | |
|---|---|---|
| GB | 2396748 | 6/2004 |
| WO | WO 98/54942 | 12/1998 |

\* cited by examiner

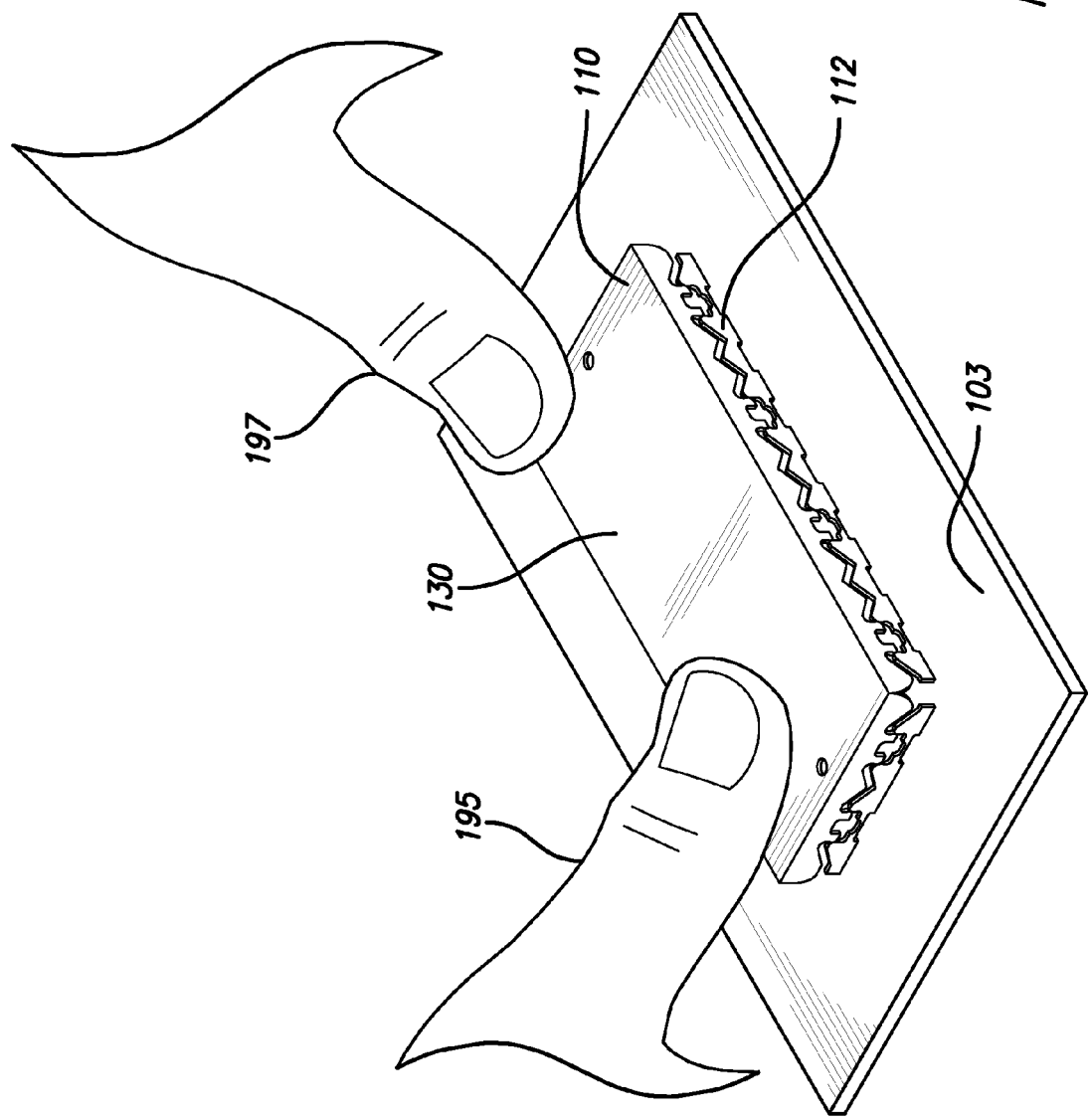

ELECTROMAGNETIC INTERFERENCE SHIELDS AND RELATED MANUFACTURING METHODS

FIELD

The present disclosure relates to shields suitable for shielding electronic components on a printed circuit board from electromagnetic interference (EMI)/radio frequency interference (RFI).

BACKGROUND

The statements in this section merely provide background information related to the present disclosure and may not constitute prior art.

Electronic equipment often generates electromagnetic signals in one portion of the electronic equipment that may radiate to and interfere with another portion of the electronic equipment. This electromagnetic interference (EMI) can cause degradation or complete loss of important signals, thereby rendering the electronic equipment inefficient or inoperable. To reduce the adverse effects of EMI, electrically conducting (and sometimes magnetically conducting) material is interposed between the two portions of the electronic circuitry for absorbing and/or reflecting EMI energy. This shielding may take the form of a wall or a complete enclosure and may be placed around the portion of the electronic circuit generating the electromagnetic signal and/or may be placed around the portion of the electronic circuit that is susceptible to the electromagnetic signal. For example, electronic circuits or components of a printed circuit board (PCB) are often enclosed with shields to localize EMI within its source, and to insulate other devices proximal to the EMI source.

As used herein, the term electromagnetic interference (EMI) should be considered to generally include and refer to both electromagnetic interference (EMI) and radio frequency interference (RFI) emissions, and the term "electromagnetic" should be considered to generally include and refer to both electromagnetic and radio frequency from external sources and internal sources. Accordingly, the term shielding (as used herein) generally includes and refers to both EMI shielding and RFI shielding, for example, to prevent (or at least reduce) ingress and egress of EMI and RFI relative to a housing or other enclosure in which electronic equipment is disposed.

SUMMARY

According to various aspects, exemplary embodiments are provided of board level shields having single piece constructions. In one exemplary embodiment, a shield having a single piece construction generally includes sidewalls configured for installation to a substrate generally about one or more electrical components on the substrate. An upper surface is integrally formed with the sidewalls. A snap latch mechanism is integrally defined by upper and lower portions of one or more of the sidewalls for releasably attaching a cover to the lower sidewall portions. The cover includes the upper surface and the upper sidewall portions. The snap latch mechanism includes first and second interlocking members and an opening. The first interlocking member is integrally defined by the one or more of upper sidewall portion, and downwardly depends relative to the upper surface. The second interlocking member is integrally defined by one or more of the lower sidewall portions, and upwardly protrudes relative to the upper surface. The opening accommodates movement of the first interlocking member inwardly relative to the opening, thereby allowing continued respective upward or downward movement of the first interlocking member relative to the second interlocking member for engaging or disengaging the snap latch mechanism. Accordingly, disengagement of the snap latch mechanism allows the cover to be completely separated from the lower sidewall portions of the shield. The cover may also be reattached to the lower sidewall portions of the shield by engagement of the snap latch mechanism.

In another exemplary embodiment, a shielding enclosure includes sidewalls and an integral top surface. The sidewalls include upper and lower portions cooperatively defining an interlock therebetween. The upper sidewall portions depend downwardly from the integral top surface. The interlock releasably attaches the integral top surface and upper sidewall portions to the lower sidewall portions. Disengaging the interlock allows the integral top surface and upper sidewall portions to be completely separated from the lower sidewall portions. The integral top surface and upper sidewall portions may also be reattached to the lower sidewall portions by engagement of the interlock.

Additional aspects relate to method of making shields and methods of providing shielding, such as board level shielding to one or more electrical components on a substrate. In one exemplary embodiment, a method generally includes stamping in a single piece of material a flat pattern partial profile for the shield including sidewalls and one or more openings in the sidewalls. The method may also include forming first and second interlocking members and a scored geometry generally between upper and lower sidewall portions. The method may further include forming the sidewalls at an angle relative to the integral top surface, as the integral top surface and upper sidewall portions are releasably retained to the lower sidewall portions. The first and second interlocking members and one or more openings define a snap latch mechanism releasably attaching an integral top surface and upper sidewall portions of the shield to the lower sidewall portions of the shield. Disengaging the snap latch mechanism allows the integral top surface and upper sidewall portions to be completely separated from the lower sidewall portions of the shield. The integral top surface and upper sidewall portions may be reattached to the lower sidewall portions of the shield by engagement of the snap latch mechanism.

In another exemplary embodiment, a method generally includes installing a shielding enclosure having a single piece construction to the board, such that shielding enclosure is disposed generally about the one or more electrical components. The shielding enclosure generally includes sidewalls and an integral top surface. The sidewalls include upper and lower portions cooperatively defining an interlock therebetween. The upper sidewall portions depend downwardly from the integral top surface. The interlock releasably attaches the integral top surface and upper sidewall portions to the lower sidewall portions. Disengaging the interlock allows the integral top surface and upper sidewall portions to be completely separated from the lower sidewall portions. The integral top surface and upper sidewall portions may be reattached to the lower sidewall portions by engagement of the interlock.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

FIGS. 6A through 6D illustrate an exemplary method by which the cover may be reattached manually by the installer's hands without using any tools or mechanical fasteners according to an exemplary embodiment.

DETAILED DESCRIPTION

Figure 1:
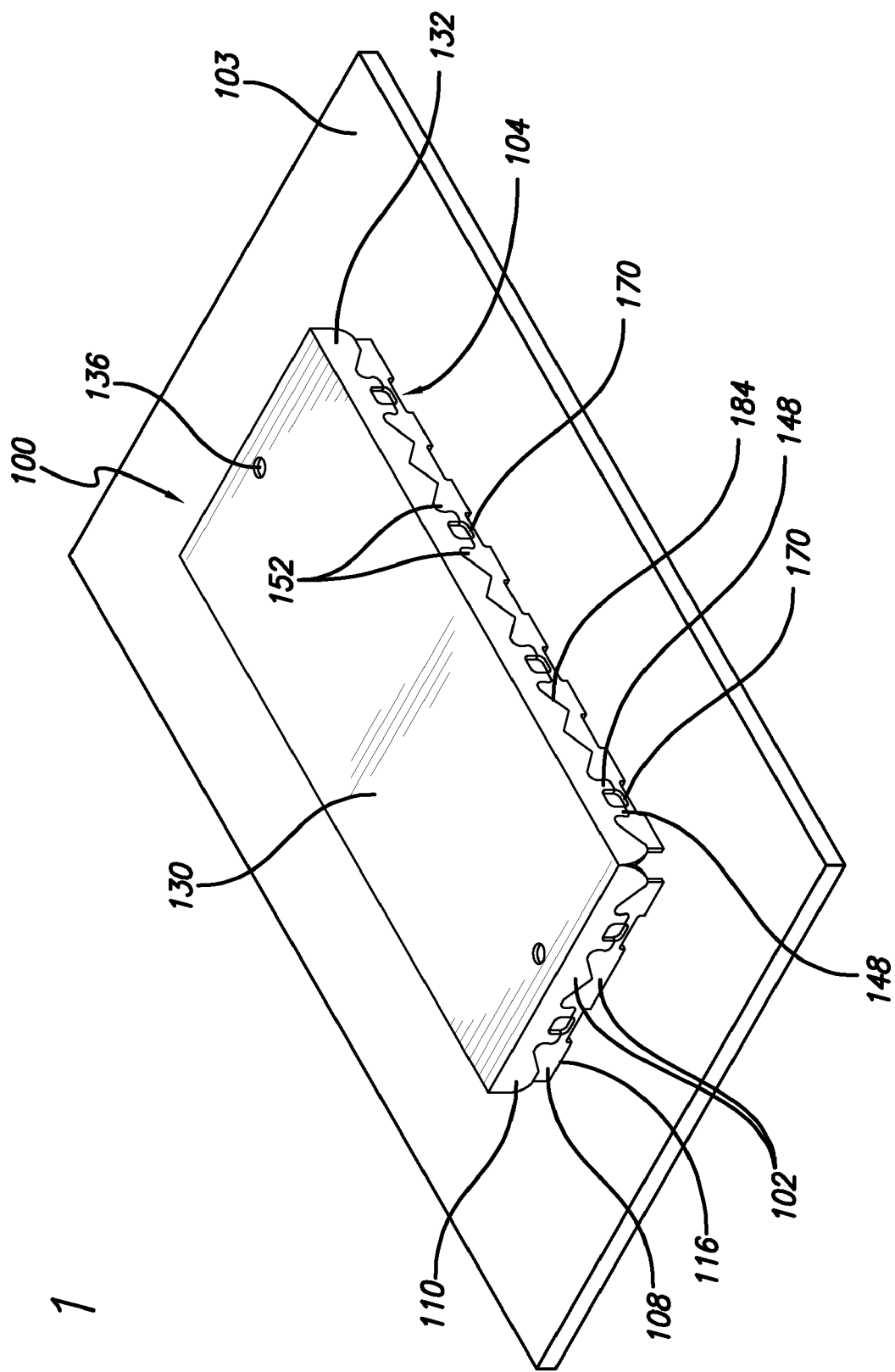
FIG. 1 is a perspective view of an exemplary shield installed to a printed circuit board (PCB) and illustrating the shield's snap latch mechanism along the shield's sidewalls detachably engaging the shield's cover to the shield's lower portion according to one exemplary embodiment.

The following description is merely exemplary in nature and is not intended to limit the present disclosure, application, or uses. It should be understood that throughout the drawings, corresponding reference numerals indicate like or corresponding parts and features.

According to various aspects, exemplary embodiments are provided of a board level shield having a single piece construction. After installation (e.g., solder reflow, etc.) of the shield to a printed circuit board (PCB), a cover or lid portion of the shield may be repetitively removed and then reattached via snap features or interlocking features defined along the shield's sidewalls while maintaining desired levels of EMI shielding performance.

By way of example, the shield's sidewalls may include one or more openings cooperatively defined between the shield's removable cover and the shield's lower portion. The shield's lower portion refers to that portion of the shield that remains installed to the PCB after the cover has been removed. In this example, the shield includes an interlock or snap latch mechanism. The snap latch mechanism includes interlocking members configured to be detachably engaged with one another. The interlocking members associated with the cover (e.g., downwardly depending from the cover's upper surface) may be resiliently flexible or compliant. Each of the openings may be configured to allow the corresponding pair of resilient flexible or compliant interlocking members to move inwardly towards each other (e.g., within the same plane that contains the sidewalls, etc.). Accordingly, the resilient flexible or compliant members may flex inwardly into the opening upon contact with camming surfaces associated with the interlocking members of the shield's lower portion. After passing beyond the camming surfaces (or at least the portion of the camming surfaces that impinge the farthest inwardly into the opening), the cover's interlocking members may then snap outwardly to frictionally engage generally under the interlocking member of the shield's lower portion. The material forming the cover's interlocking members may be sufficiently resilient such that the cover's interlocking members may essentially operate as outwardly biased resilient tines that snap outwardly for frictional engagement generally under the interlocking members of the shield's lower portion. In this exemplary snap fitting manner, the cover may thus be reattached. The configuration (e.g., shape, size, material used, etc.), location, and particular number of openings and the interlocking members may be varied depending, for example, on the particular installation. For example, the openings may be generally rectangular, circular, rectangular, square, triangle, etc.

The shield's sidewalls may also include a scored geometry generally between each corresponding set of interlocking members and opening. The particular profile of the scored geometry may be varied or altered depending, for example, on the particular installation intended for the EMI shield. In some embodiments, the scored geometry may have a sawtooth configuration, zigzag configuration, jagged tooth configuration, etc. For example, the scored geometry may include generally a triangular-tooth like pattern between each corresponding set of interlocking members and opening. This triangular-tooth like pattern helps avoid long length slots that would be counterproductive to EMI suppression, by reducing the effective slot length along the interface between the cover and the lower portion of the shield, thereby providing better EMI shielding performance.

The shield may be made from the same single piece of material (e.g., sheet metal, etc.). For example, a flat profile pattern for the shield may be stamped into a piece of material. The flat profile pattern may include the openings in the shield's sidewalls that allow the interlocking members to move inwardly. The flat profile pattern may also include mounting feet for attaching the shield to a PCB. The stamping process is followed by scoring or shear cutting of the sidewall pattern (e.g., sawtooth configuration, zigzag configuration, jagged tooth configuration, etc.). This scoring or shear cutting is accomplished in a manner that includes pressing the shield's lower portion back into its original position. At this point, the shield's lower portion is connected to the cover solely the frictional engagement of the interlocking members defining the snap latch mechanism. The shield's sidewalls may then be formed, bent, drawn, shaped, folded, etc. so as to be generally perpendicular to the cover's upper surface. Additional embossing or crimping operations may then be performed across the score/cut line to ensure proper retention of the shield's lower portion to the cover, for example, during handling, packaging, pick & place operations, and/or customer installation/solder reflow, etc.

Unlike existing shields having hingedly attached covers, various embodiments disclosed herein include shields with covers or lid portions that may be completely removed or separated, and then be reattached via snap features or interlocking features along the shield's sidewalls. For example, the shield (with the cover attached via the interlock or snap latch mechanism) may be installed (e.g., solder reflowed, etc.) to a substrate (e.g., printed circuit board, etc.). The cover may then be removed, for example, to access the electrical components on the PCB. The cover may subsequently be re-assembled or reattached via the snap latch mechanism or interlock.

Accordingly, various embodiments disclosed herein provide a board level shield having a single piece construction, where the cover may be attached, removed, and reattached repeatedly via a snap latch mechanism or interlock defined along the sidewalls of the shield. Advantageously, this may allow for cost savings and/or reduced installation time as compared to those existing board level shield solutions that require a frame and a cover formed from two different pieces of material or that require the cover to be destructively removed and thus unusable, such that a replacement cover must be used. As compared to various embodiments disclosed herein, the inventor hereof has realized a shield with a single piece type construction may allow for improvements in raw material cost (less material is needed as compared to solutions in which cover and frame are made from separate pieces of material), direct labor assembly costs, tooling costs, and achievable yields.

Forming the shield with the snap latch mechanism integrally defined by the shield's sidewalls from the same single piece of material also allows for a reduced shield foot print size relative to the required area/volume under the shield. Because the snap latch mechanism is integrally formed with or defined by the shield's sidewalls, the snap latch mechanism does not require or add any additional length, width, or height to the shield.

Figure 2:
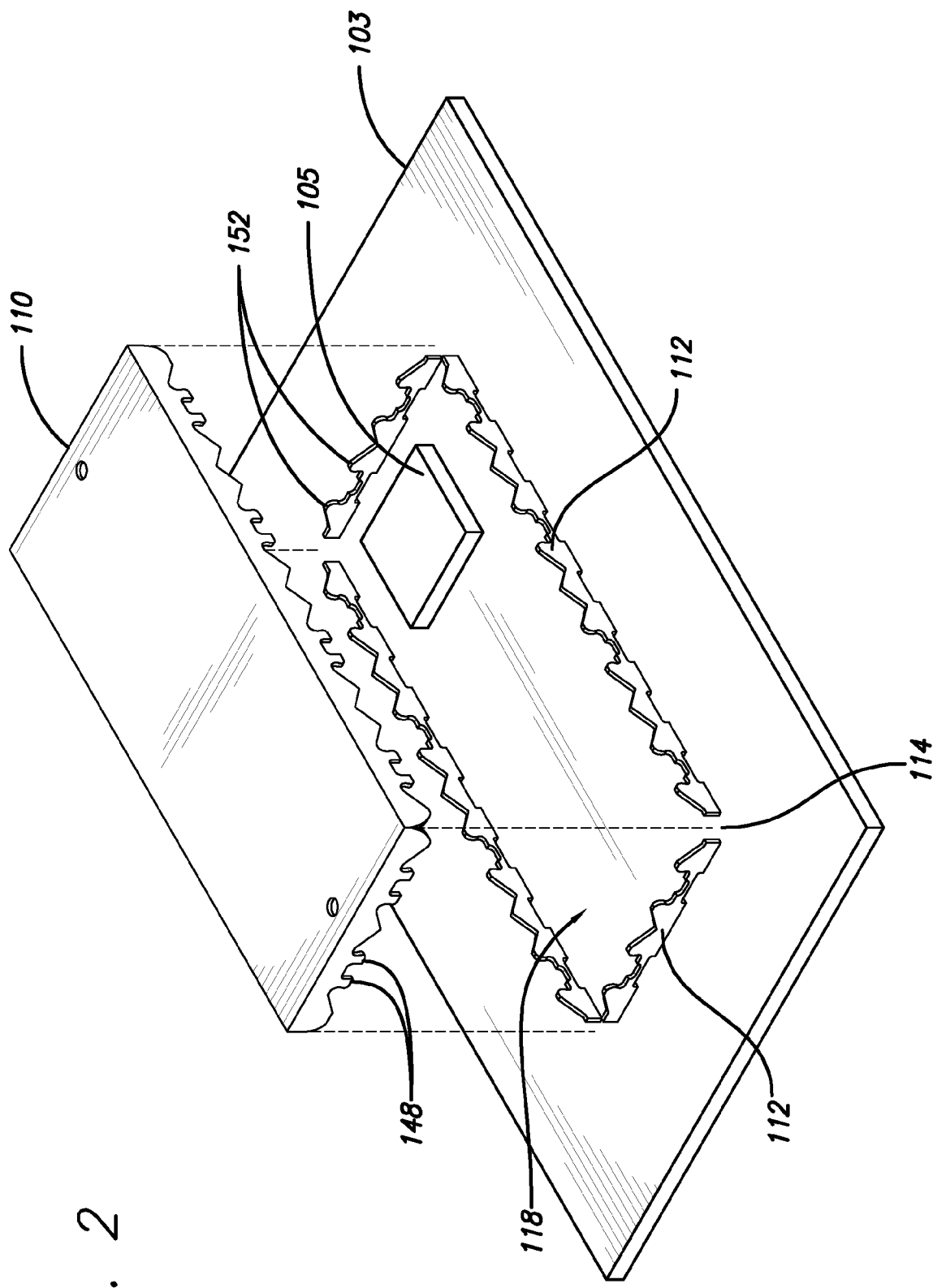
FIG. 2 is an exploded perspective view of the shield shown in FIG. 1 with the cover detached after disengagement of the shield's snap latch mechanism.
Figure 3:
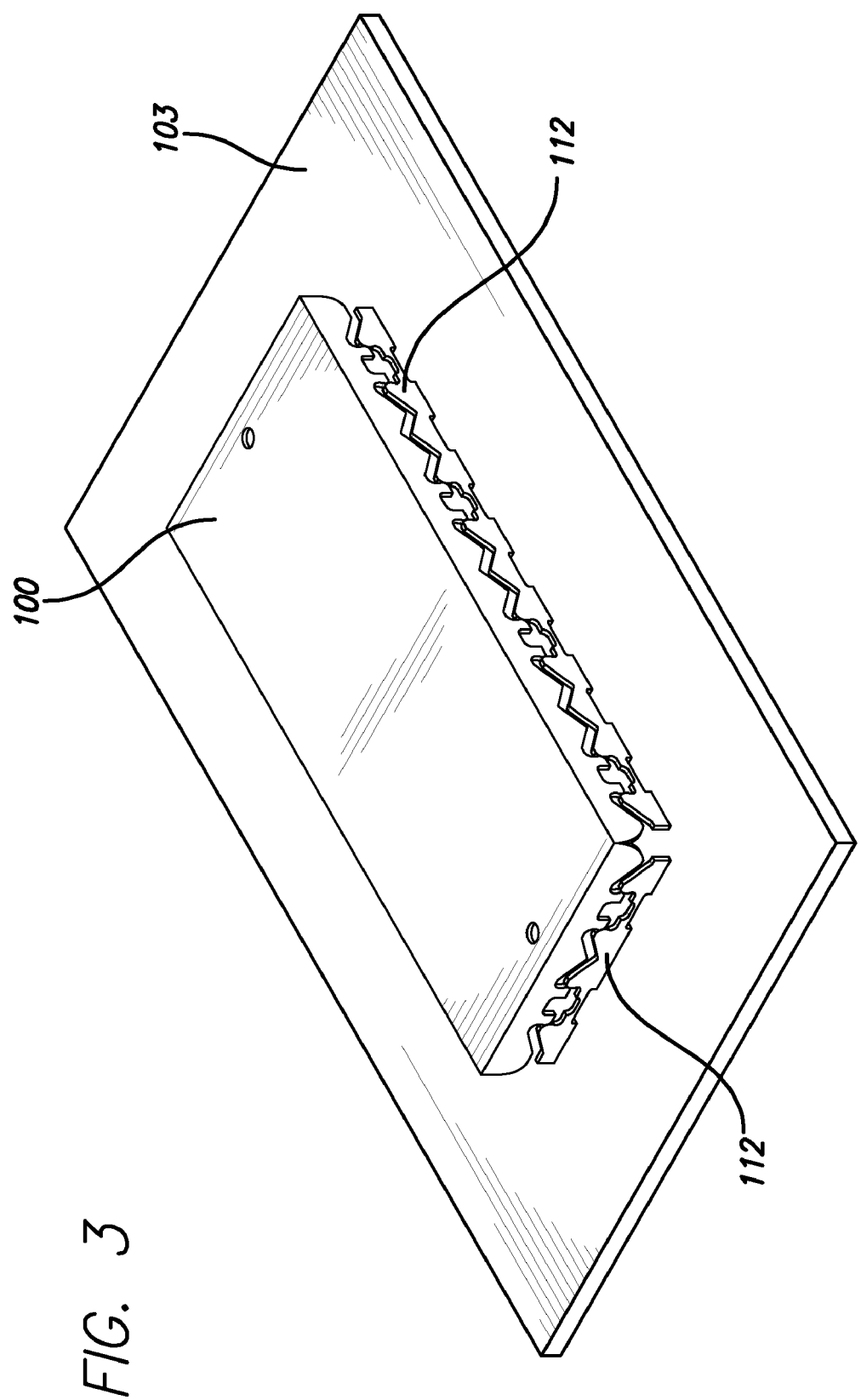
FIG. 3 is a perspective view of the shield shown in FIG. 1 and illustrating the cover's interlocking members aligned for engagement with the corresponding interlocking members of the shield's lower portion.

Referring now to the drawings, FIGS. 1 through 3 illustrate an exemplary embodiment of a shield 100 embodying one or more aspects of the present disclosure. As shown in FIGS. 1 and 3, the shield 100 may be installed to a printed circuit board 103 (a PCB, and broadly a substrate) and is suitable for use in providing electromagnetic interference (EMI) shielding to one or more electrical components 105 (FIG. 2) mounted on the PCB 103.

The shield 100 generally includes sidewalls 102 and a snap latch mechanism or interlock 104 integrally formed or defined by the sidewalls 102. The shield 100 also includes a lower portion or frame 108 and a cover or lid portion 110. The snap latch mechanism 104 is configured to allow the cover 110 to be repeatedly removed and reattached as described herein. In the immediate embodiment, the shield's lower portion 108 and cover 110 may be advantageously made from a single sheet of material, as described herein.

The shield's lower portion 108 is configured (e.g., sized, shaped, etc.) to be installed (e.g., surface mounted, secured, etc.) to the PCB 103 by any acceptable means such as soldering, mechanical fastening, etc. When the cover 110 is releasably attached to the lower portion 108, the lower portion 108 and the cover 110 can enclose the desired electrical components 105 on the PCB 103 and provide EMI shielding thereto.

As shown in FIG. 2, the shield's lower portion 108 has a generally rectangular configuration. The shield's lower portion 108 includes four pieces or wall portions 112 spaced apart from each other at the corners by gaps 114. When the cover 110 is removed, the lower portion 108 remains attached to the PCB 103. In this particular embodiment, the gaps 114 at the corners between the adjacent pieces 112 are a result of the lower portion 108 and cover 110 being made from a single piece of material.

Adjacent pieces 112 of the lower portion 108 are oriented generally at right angles to each other, and opposing pieces 112 are generally parallel. Accordingly, the four pieces 112 thus provide a generally rectangular shape for the lower portion 108. In other exemplary embodiments, shields may include a lower portion or frame having more than or fewer than four pieces and/or in a configuration different from that shown in the figures herein. For example, the lower portion or frame may have square configurations, triangular configurations, hexagonal configurations, other polygonal-shaped configurations, circular configurations, non-rectangular configurations, etc.

As shown in FIG. 2, the pieces 112 of the shield's lower portion 108 are configured to be positioned generally about electrical components 105 on the PCB 103. In the illustrated shield 100, the lower portion 108 has an open top 118 that may be used, for example, to access electrical components 105 on the PCB 103 contained within the lower portion 108 after the lower portion 108 is installed to the PCB 103. In addition, the illustrated lower portion 108 (and cover 110) is free of interior dividers so that the shield 100 generally defines a single interior space (or compartment) for shielding the one or more electrical components on the PCB 103. In other exemplary embodiments, shields may include cross bracing such that the shield's lower portion or frame include more than one opening. In still other exemplary embodiments, a shield may include a lower portion or frame with one or more interior dividers attached to sidewalls thereof for sectioning the frame into two or more interior spaces. Still further embodiments may include a shield having a lower portion or frame with sidewalls connected to one another at the corners.

As shown in FIGS. 1 through 3, the shield's lower portion 108 includes mounting feet 116 for contacting one or more components of a PCB 103 to establish or provide for electrical contact with the PCB 103. The mounting feet 116 are formed as an integral part of the shield 100. The lower portion 108 may be made of a material suitable for soldering the feet 116 to traces on the PCB 103.

While the mounting feet 116 may be soldered to a PCB 103, the lower portion 108 may also be affixed to a PCB by any suitable manner desired, such as adhesives, mechanical fasteners, clips, etc. In one exemplary embodiment, the lower portion 108 may be attached to a PCB via soldering the mounting feet 116 to grounded traces positioned on the PCB substrate and/or around the electrical circuits generating (or requiring protection from) electromagnetic interference as well as around the electrical circuits that are susceptible to interference.

A non-exhaustive list will now be provided of exemplary materials for the lower portion 108 (and also the cover 110 which may be made from the same single piece of material). Exemplary materials include cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. In addition, the lower portion 108 may be formed from a plastic material coated with electrically-conductive material. In one exemplary embodiment, a shield includes a frame formed from a sheet of cold rolled steel having a thickness of about 0.20 millimeters. As another example, a shield may include a frame configured from a suitable material having a thickness in the range of about 0.10 millimeters and about 0.30 millimeters. The materials and dimensions provided herein are for purposes of illustration only, as a frame may be configured from different materials and/or with different dimensions depending, for example, on the particular application, such as the electrical components to be shielded, space considerations within the overall electronic device, EMI shielding and heat dissipation needs, and other factors.

With continued reference to FIGS. 1 through 4, the cover 110 of the shield 100 is shown with a generally rectangular shape generally corresponding to the shape defined by the shield's lower portion 108. The cover 110 is configured to fit generally over the shield's lower portion 108 for covering the open top 118 of the lower portion 108. At which point, the lower portion 108 and cover 110 may cooperate to provide shielding to the one or more electrical components 105 on the PCB 103 disposed within the area cooperatively defined by the lower portion 108, the cover 110, and the PCB 103. In other exemplary embodiments, shields may include covers having shapes different from that shown in the figures herein, but generally corresponding to shapes of the lower portions or frames of the shields. For example, covers may have square configurations, triangular configurations, hexagonal configurations, other polygonal-shaped configurations, circular configurations, non-rectangular configurations, etc. Furthermore, covers may include shapes different from shapes of frames within the scope of the present disclosure.

The cover 110 includes an upper surface 130 and wall or lip portions 132 depending generally downwardly from the upper surface 130. The cover's wall portions 132 are formed integrally (or monolithically) with the upper surface 130. In the illustrated embodiment, the upper surface 130 is generally planar in shape and the wall portions 132 are generally perpendicular to the upper surface 130.

The cover's upper surface 130 includes apertures or holes 136, which may facilitate solder reflow heating interiorly of the cover 110, may enable cooling of the electrical components 105 within the shield 100, and/or may permit visual inspection of members of the electrical components 105 beneath the cover 110. In some exemplary embodiments, shields may include covers with holes that are sufficiently small to inhibit passage of interfering EMI. The particular number, size, shape, orientation, etc. of the holes may vary depending, for example, on the particular application (e.g., sensitivity of the electronics where more sensitive circuitry may necessitate the use of smaller diameter holes, etc.). For example, some exemplary shields may include covers without any such holes.

The cover's upper surface 130 may also include a generally central pick-up surface configured for use in handling the cover 110 with pick-and-place equipment (e.g., vacuum pick-and-place equipment, etc.). The pick-up surface may be configured for use as a pick-up area that may be gripped or to which suction may be applied by the pick-and-place equipment for handling during, for example, fabrication of the shield 100 and/or original installation of the shield 100 (with the cover 110 attached to the lower portion 108) to the PCB 103. The pick-up surface may allow for balanced manipulation of the cover 110 during handling of the cover 110 and/or shield 100 (with the cover 110 attached to the lower portion 108). In other exemplary embodiments, shields may include covers with, for example, tabs at corners and/or along side edges for use as pick-up surfaces in addition to or in place of centrally located pick-up surfaces.

The shield 100 also includes the snap latch mechanism or interlock 104 integrally formed or defined by the shield's sidewalls 102. The snap latch mechanism 104 is configured to allow the cover 110 to be repeatedly removed and reattached as described herein. The snap latch mechanism 104 may allow the cover 110 to be readily removed and separated from the lower portion 108, for example, by using a shim or other suitable tool (e.g., FIGS. 5A through 5C, etc.). The same cover 110 may then be reassembled and reattached back onto the lower portion 108. The snap latch mechanism 104 may be configured such that the cover 110 may be snap fit onto the lower portion 108 without requiring the use of any tool (e.g., FIGS. 6A through 6D, etc.).

Figure 4:
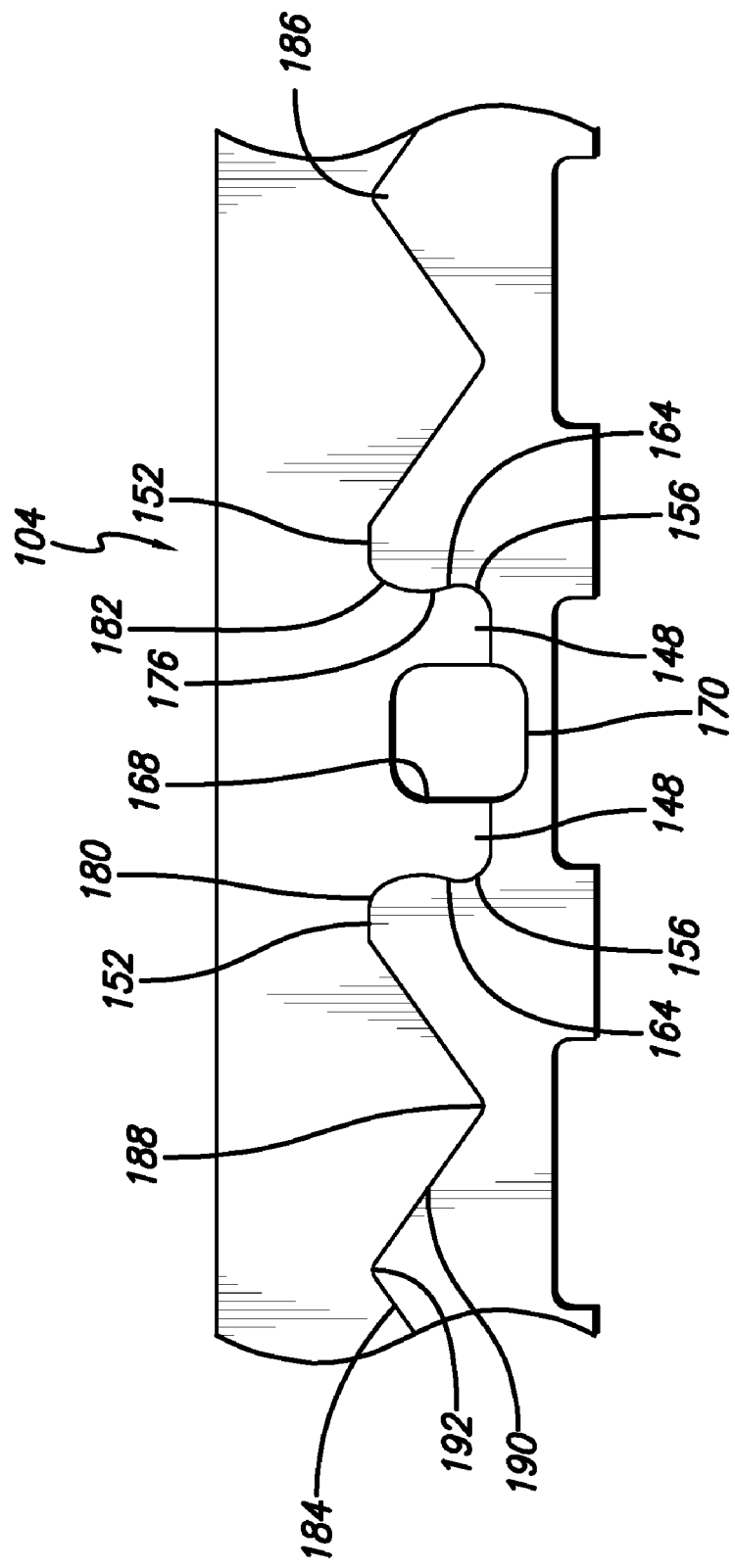
FIG. 4 is a partial side elevation view of a portion of the shield shown in FIG. 1 and illustrating the engagement of two of the cover's interlocking members with corresponding interlocking members of the shield's lower portion.

With reference now to FIG. 4, the snap latch mechanism 104 includes interlocking members 148 and 152 disposed along each of the four sides of the shield 100. The interlocking members 148 and 152 are configured to be detachably engaged with one another. When the interlocking members 148 and 152 are engaged with one another, the cover 110 is detachably retained to the lower portion 108 of the shield 100, as shown in FIG. 1.

As shown in FIG. 3, the interlocking members 148 are integrally defined by or formed with the cover 110. The interlocking members 148 depend downwardly from the cover's upper surface 130. The interlocking members 148 include protrusions 156 having a tapered side surface portion 164 and another side surface 168 defining a portion of the opening 170.

The interlocking members 152 are integrally defined by or formed with the shield's lower portion 108. The interlocking members 152 extend generally upwardly toward the cover 110. The interlocking members 152 comprise cutouts or voids extending generally inwardly and downwardly into the lower portion 108 of the shield 100. The side surface portions 176 of each cutout are complementary in shape to tapered side surface portion 164 of the corresponding interlocking members 148. When the cover's interlocking members 148 are inserted into and engaged with the corresponding interlocking members 152, portions 176 of the interlocking members 152 respectively engage (e.g., frictionally retain, etc.) the tapered portions 164 of the corresponding interlocking members 148. Also shown in FIG. 4, the openings 170 may include portions defined by side surface portions of each cutout.

In the illustrated embodiment, the cover's interlocking members 148 may be formed from a sufficiently resilient or compliant material to allow the cover's interlocking members 148 to move inwardly towards each other and into the opening 170 (FIG. 4), during reattachment of the cover 110. For example, the interlocking members 148 may move or flex inwardly into the opening 170 while generally remaining within the same plane having the shield's sidewalls 102.

As the cover 110 is moved downward onto the lower portion 108, the cover's interlocking members 148 may contact cam surfaces 180 of the interlocking members 152. The interlocking members 148 may be generally resilient in nature such that contact with the cam surfaces 180 causes the interlocking members 148 to flex inwardly into the opening 170. But after passing beyond the cam surfaces 180 (or the portions 182 of the cam surfaces 180 that impinge the farthest inwardly into the opening 170), the cover's interlocking members 148 may then snap outwardly to thereby frictionally engage the tapered portions 164 of the cover's interlocking members 148 with the portions 176 of the interlocking members 152. The material forming the cover's interlocking members 148 may be sufficiently resilient such that the cover's interlocking members 148 may essentially operate as outwardly biased resilient tines that snap outwardly for frictional engagement generally under the interlocking members 152 of the shield's lower portion 108. In this exemplary snap fitting manner, the cover 110 may thus be reattached.

In the particular illustrated embodiment of FIG. 4, the lower portion 108 and cover 110 cooperatively define eight openings 170 and corresponding pairs of the interlocking members 148, 152 along each side of the opening 170. Accordingly, the snap latch mechanism 104 thus includes two snap or interlocking features along each shorter side of the shield 100 and four snap or interlocking features along each longer side of the shield 100.

The configuration (e.g., shape, size, material used, etc.), location, and particular number of openings 170 and interlocking members 148, 152 may be varied depending, for example, on the particular installation. For example, the openings 170 in the illustrated embodiment are generally rectangular. Alternatively, the openings may be in other shapes, such as circular, rectangular, square, triangle, etc. Alternative configurations (e.g., shapes, sizes, etc.) may also be used for the interlocking members 148 and 152, and aspects of the present disclosure are not limited to the particular configuration of the snap latch mechanism 104 shown in FIGS. 1 through 4. Alternative embodiments can include other means for detachably engaging the cover 110 to the shield's lower portion 108.

The shield's sidewalls 102 may also include a scored geometry 184 generally between each corresponding set of interlocking members 148, 152 and opening 170 along the interface between the lower portion 108 and cover 110. The particular profile of the scored geometry 184 may be varied or altered depending, for example, on the particular installation intended for the EMI shield. In some embodiments, the scored geometry 184 may have a sawtooth configuration, zigzag configuration, jagged tooth configuration, etc.

In the illustrated embodiment of FIGS. 1 through 4, the scored geometry 184 comprises a generally triangular-tooth like pattern between each corresponding set of interlocking members 148, 152 and opening 170. This triangular-tooth like pattern preferably helps avoid long length slots that would be counterproductive to EMI suppression, by reducing the effect slot length and thus helping provide better EMI shielding performance.

In the illustrated embodiment, the portion of the scored geometry 184 associated with the lower portion 108 includes upwardly protruding portions 186 and recesses 188 defined generally between adjacent pairs of the upwardly protruding portions 186. The portion of the scored geometry 184 associated with the cover 110 includes downwardly protruding portions 190 and recesses 192 defined generally between adjacent pairs of the downwardly protruding portions 190.

As shown in FIG. 3, the protruding portions 186 and 190 are generally triangular in shape. The recesses 188 and 192 of the lower portion 108 and cover 110, respectively, are shaped so as to correspond with the generally triangular-shaped protruding portions 186 and 190 to be engagingly received thereby. Accordingly, this exemplary embodiment has a scored geometry 184 with a sawtooth configuration. Alternative configurations (e.g., zigzag configuration, jagged tooth configuration, rectangular toothed configuration, etc.) may also be employed for the scored geometry 184. For example, the particular profile of the scored geometry 184 may be varied or altered depending, for example, on the particular installation intended for the EMI shield. In some embodiments, the scored geometry may be configured to help avoid long length slots that would be counterproductive to EMI suppression. That is the scored geometry may be configured so as to reduce the effective slot length along the interface between the cover and the lower portion of the shield, which, in turn, improves EMI shielding performance.

The shield 100 may be formed from a single piece of material (e.g., single blank of sheet metal material, etc.). For the illustrated embodiment of FIGS. 1 through 4, the shield's lower portion 108 and cover 110 are sized such that the material for the cover 110 may be nested in the area of material for the lower portion 108, thereby allowing the lower portion 108 and cover 110 to be substantially simultaneously fabricated from the same single blank or strip of material.

In one exemplary embodiment, a flat profile pattern for the shield 100 may be stamped into a piece of material. The flat profile pattern may include the openings 170 in the shield's sidewalls 102 that allow the interlocking members 148, 152 to move inwardly. The flat profile pattern may also include mounting feet 116 for attaching the shield 100 to a PCB. The stamping process may then be followed by scoring or shear cutting of the sidewall pattern, including the scored geometry 184 and the interlocking members 148, 152. This scoring or shear cutting is accomplished in a manner that includes pressing the shield's lower portion 108 back into its original position. At this point, the shield's lower portion 108 is retained to the cover 110 solely by the frictional engagement of the interlocking members 148, 152 defining the snap latch mechanism 104. The shield's sidewalls 102 may then be formed, bent, drawn, shaped, folded, etc. into the configuration shown in FIGS. 1 through 3 (e.g., sidewalls 102 generally perpendicular to the cover's upper surface 130, etc.). Additional embossing or crimping operations may then be performed across the score/cut line 184 to help ensure retention of the shield's lower portion 108 to the cover 110, for example, during handling, packaging, pick & place operations, and/or customer installation/solder reflow, etc.

Some embodiments may also include drawing the single piece of material so as to form drawn portions for the corner section of the two-piece shield. The corner sections may downwardly depend relative to the upper surface of the cover and integrally connect a corresponding pair of the cover's sidewalls to the cover's upper surface.

Even though the lower portion 108 and cover 110 may be formed (e.g., stamping and bending/folding/drawing, etc.) from the same piece of material substantially simultaneously in this example, such is not required for all embodiments. For example, other embodiments may include one or more discrete components separately attached to the shield 100, for example, by welding, adhesives, among other suitable methods. Alternative configurations (e.g., shapes, sizes, etc.), materials, and manufacturing methods may be used for making the shield 100, shield lower portion 108, and/or cover 110.

Figure 5A:
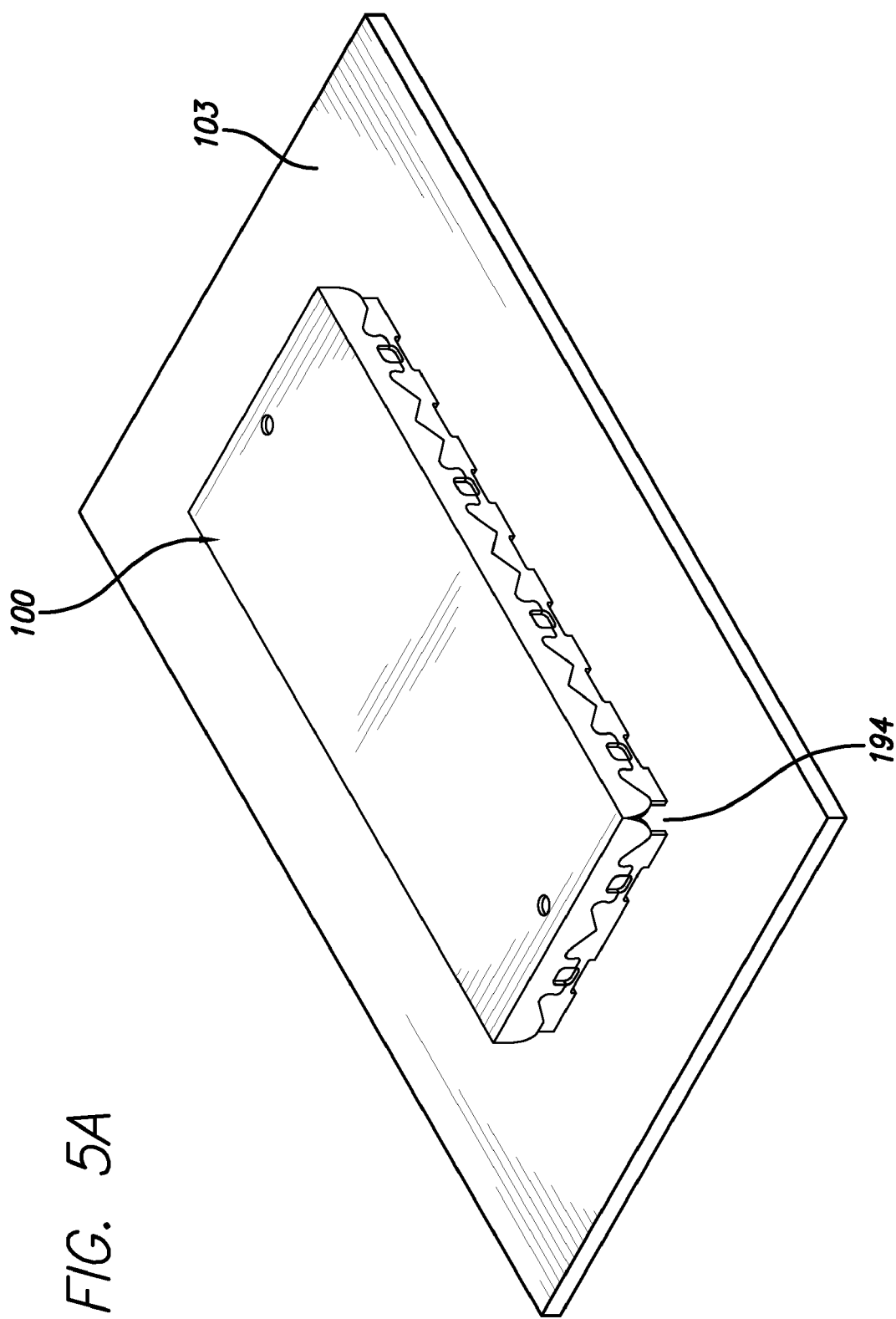
FIGS. 5A through 5C illustrate an exemplary method in which a shim may be used to disengage the snap latch mechanism for detaching the cover according to an exemplary embodiment.
Figure 5B:
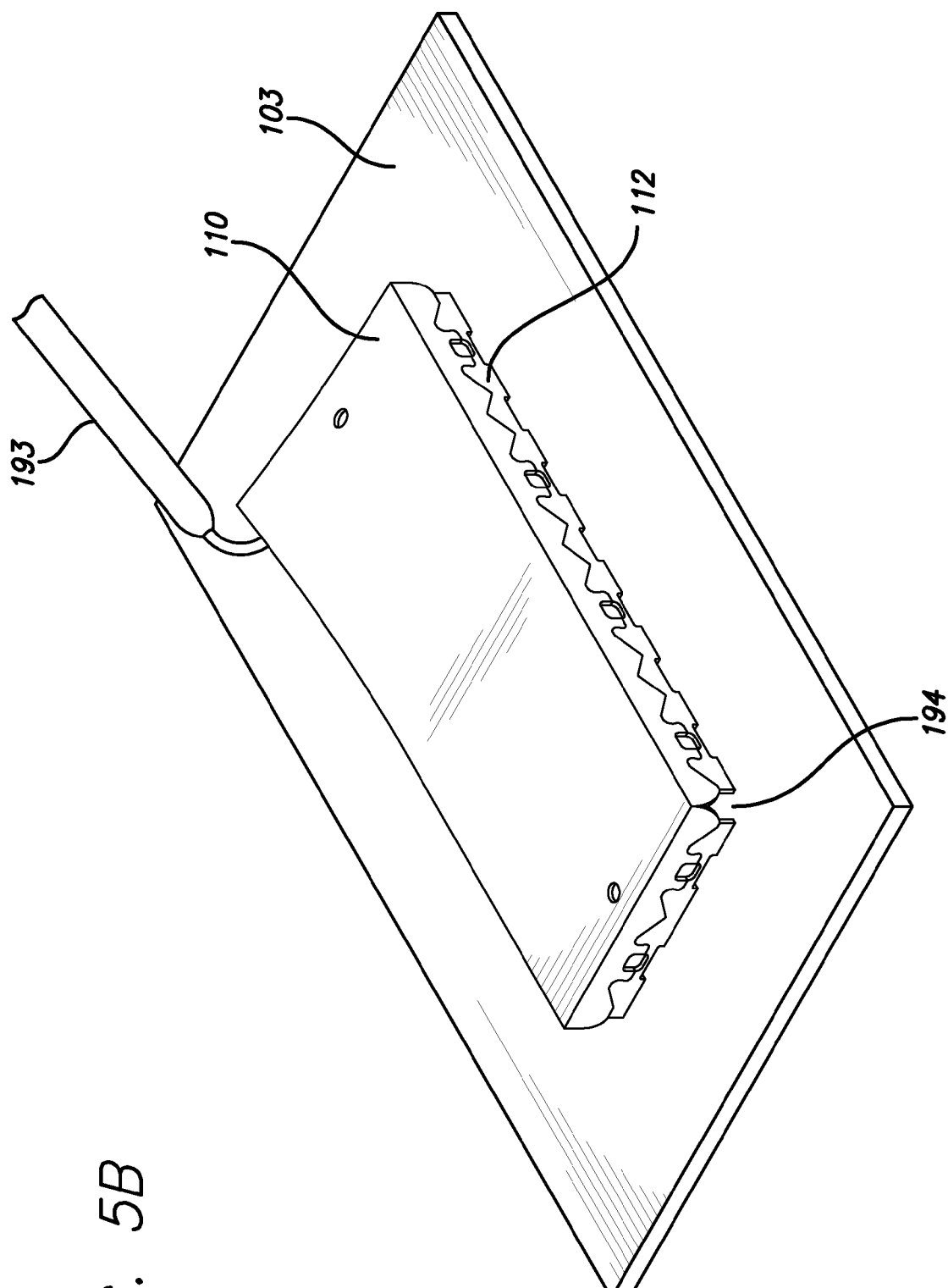
Figure 5C:
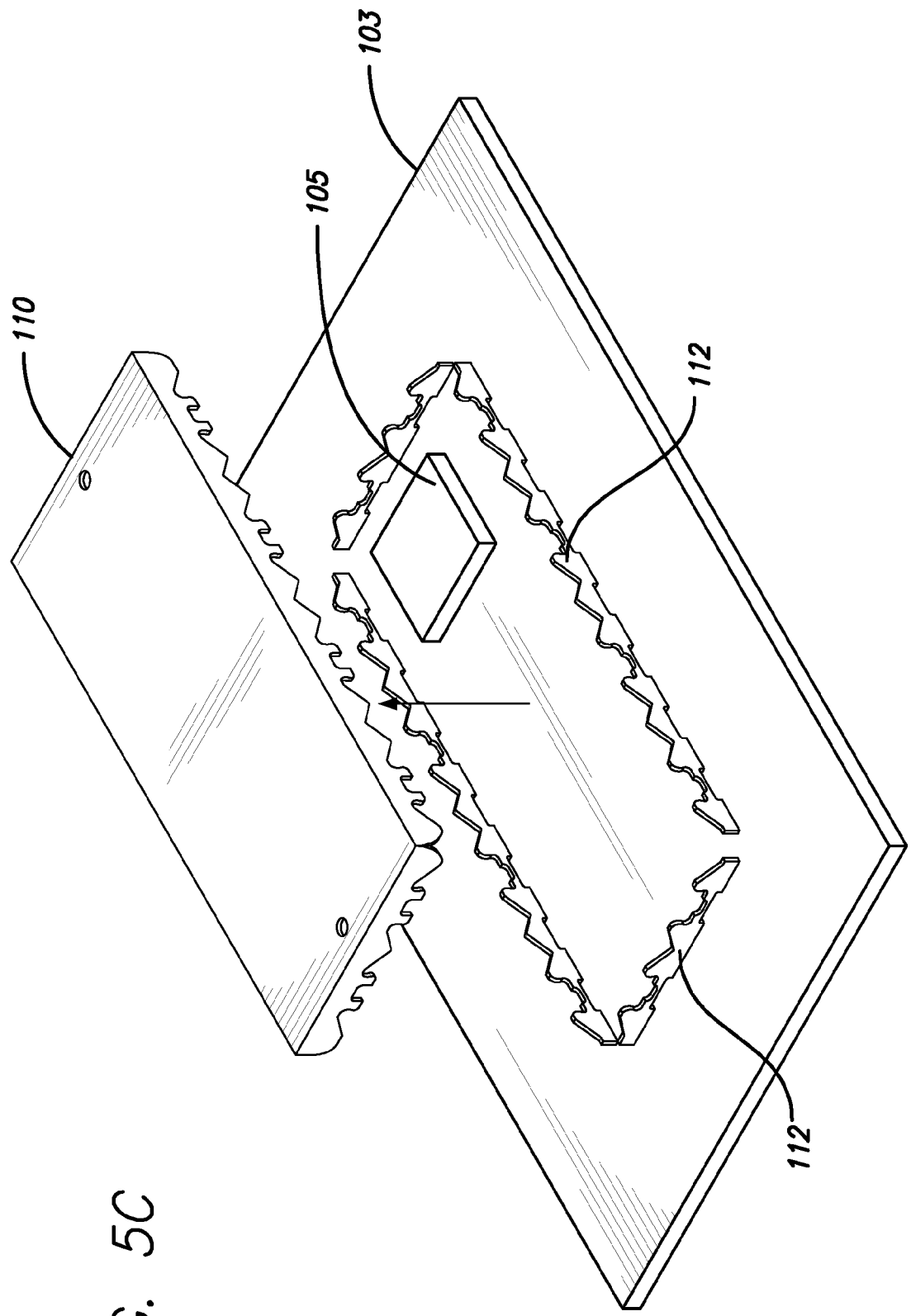

By way of example only, a description will now be provided of an exemplary method by which the cover 110 may be detached or removed from the lower portion 108. As shown in FIG. 5A, an installer may select a tool to assist in the removal process, such as a shim 193 or other suitable tool. The installer may then manually position or insert the shim 193 into an opening 194 cooperatively defined generally between a corner of the cover 110 and the shield's lower portion 108. Alternatively, the shim 193 may instead be positioned into another opening, such as one of the openings 170 or holes 136 in the cover's upper surface 130. The installer may apply force to the shim 193 in order to force the disengagement of the snap latch mechanism 104. Upon disengagement of the snap latch mechanism 104, the cover 110 may then be lifted off and separated from the shield's lower portion 108, as shown in FIG. 5C.

In some embodiments, this process of inserting the shim 193 and applying force may need to be repeated at more than one location along the shield's periphery in order to disengage all locations (e.g., eight in the illustrated embodiment, etc.) at which the snap features are located.

The lower portion 108 and cover 110 are preferably configured such that the snap latch mechanism 104 is resistant to yielding and capable of being repeatedly engaged and disengaged. This, in turn, thus accommodates multiple and repeated cycles of attachment, detachment, and reattachment of the cover 110 to the lower portion 108. Accordingly, the resilient nature of the lower portion 108 and cover 110 preferably causes the interlocking members 148, 152 to return to their original configuration (e.g., for example, if they were reconfigured when the shim was applying force to remove the cover 110 from the lower portion 108, etc.) so that the cover 110 may the be subsequently reattached to the lower portion 108.

Figure 6B:
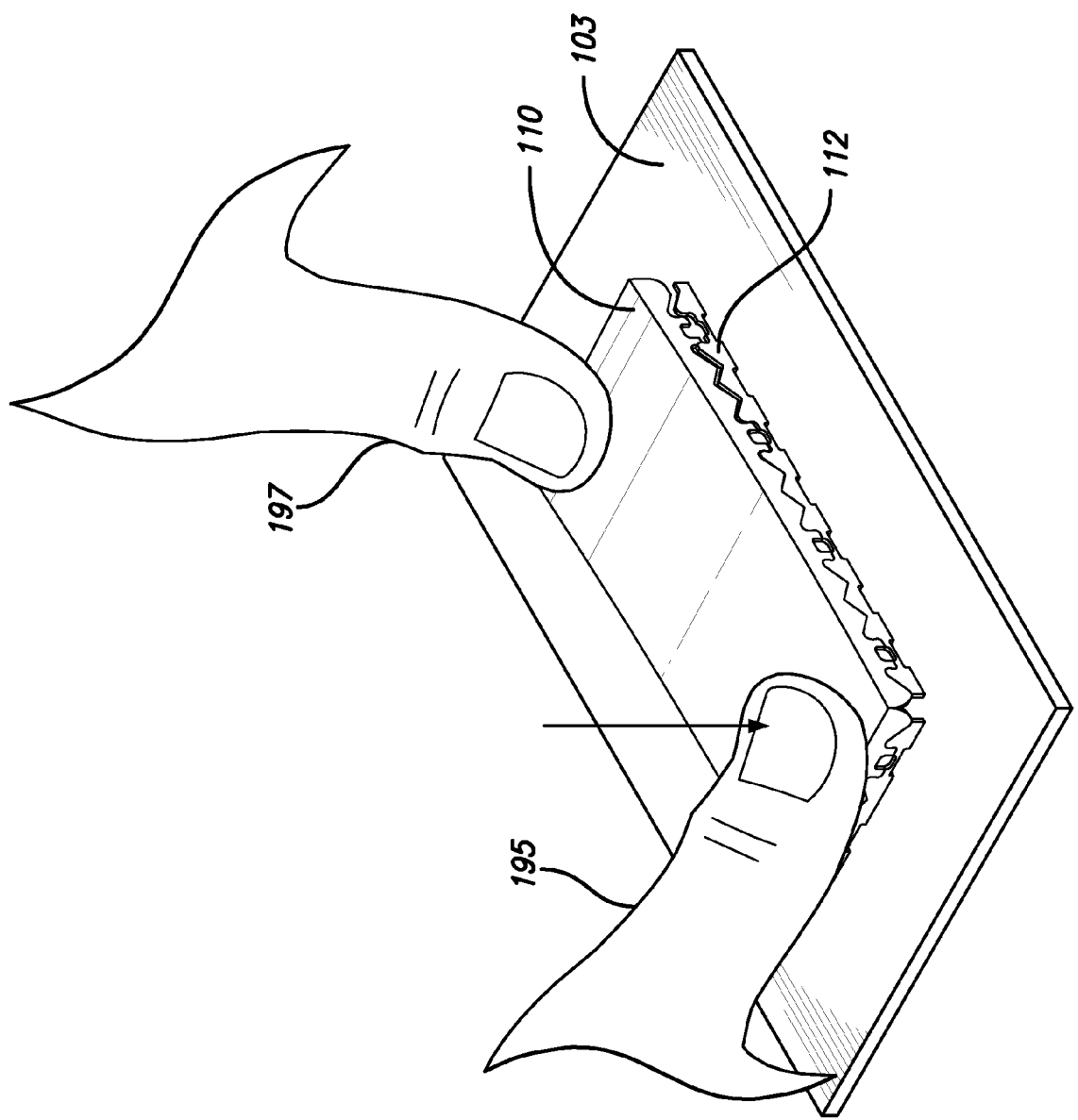
Figure 6C:
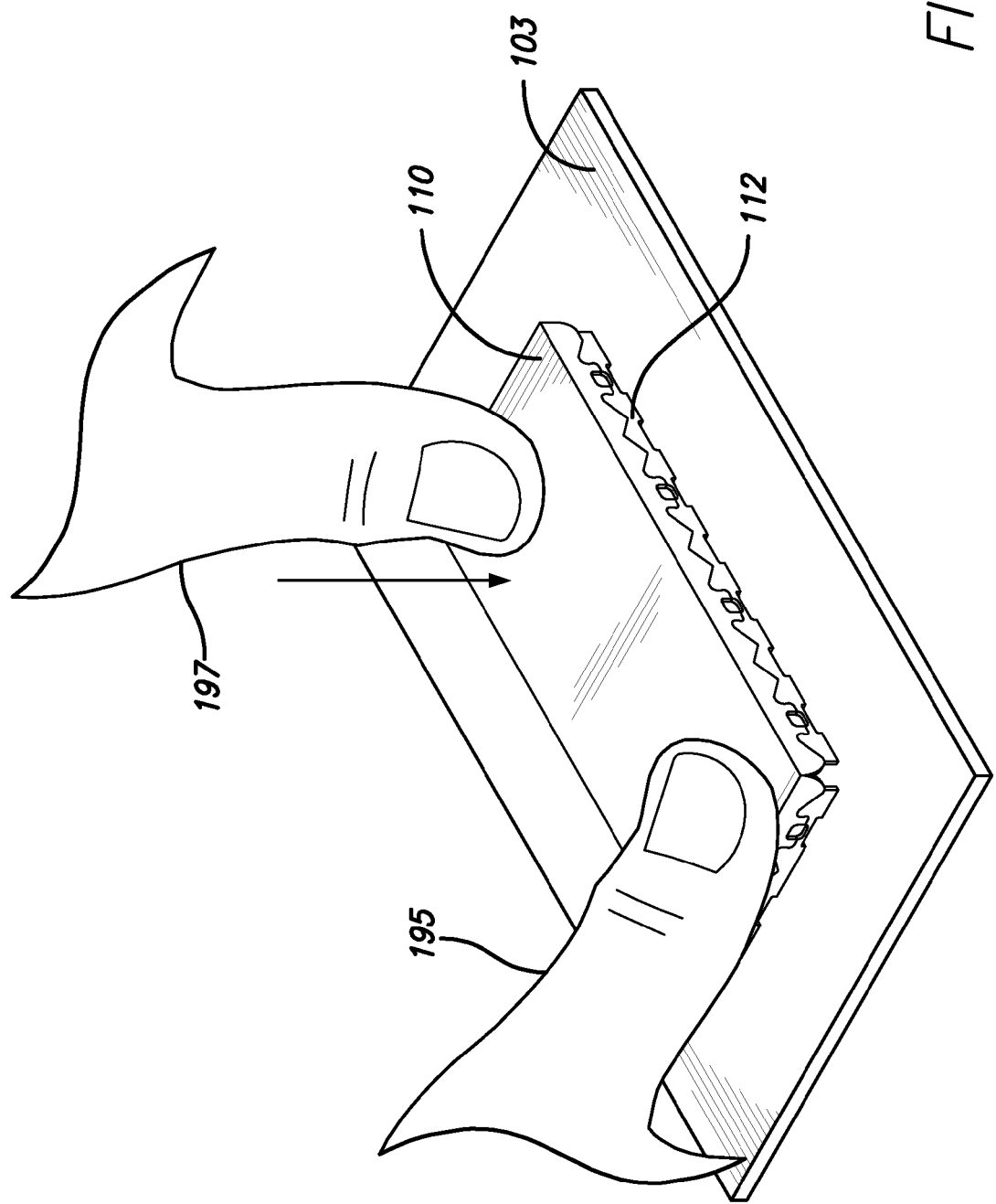
Figure 6D:
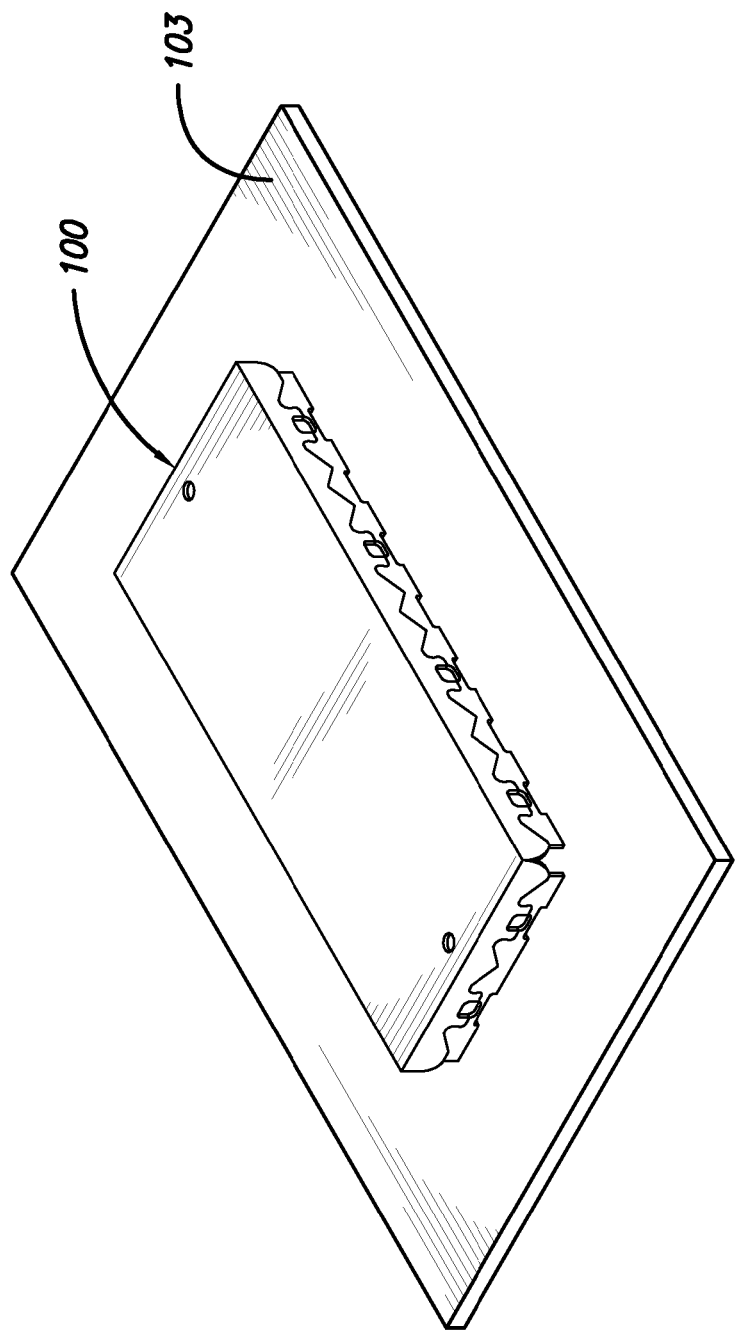

By way of further example, a description will now be provided of an exemplary method by which the cover 110 may be re-attached or re-assembled to the lower portion 108. As shown in FIG. 6A, the cover 110 may first be placed upon the lower portion 108 with the cover's interlocking features 148 aligned for engagement with the interlocking features 152 of the shield's lower portion 108. The installer then places the installer's finger 195 against the upper surface 130 of the cover 110 adjacent one side (the left side is shown in FIG. 6B) of the cover 110, and presses downwardly with sufficient force to cause the interlocking engagement of a portion of the snap latch mechanism 104. The installer then presses downwardly with another finger 197 against the cover's upper surface 130 adjacent the other side (the right side is shown in FIG. 6C) to cause the interlocking engagement of the remainder of the snap latch mechanism 104. Accordingly, the cover 110 is thus reattached to the lower portion 108 (FIG. 6D) in this exemplary manner. Alternatively, other manual methods or automatic methods (e.g., pick and place equipment, etc.) may be used for attaching the cover 110 to the lower portion 108.

Figure 7:
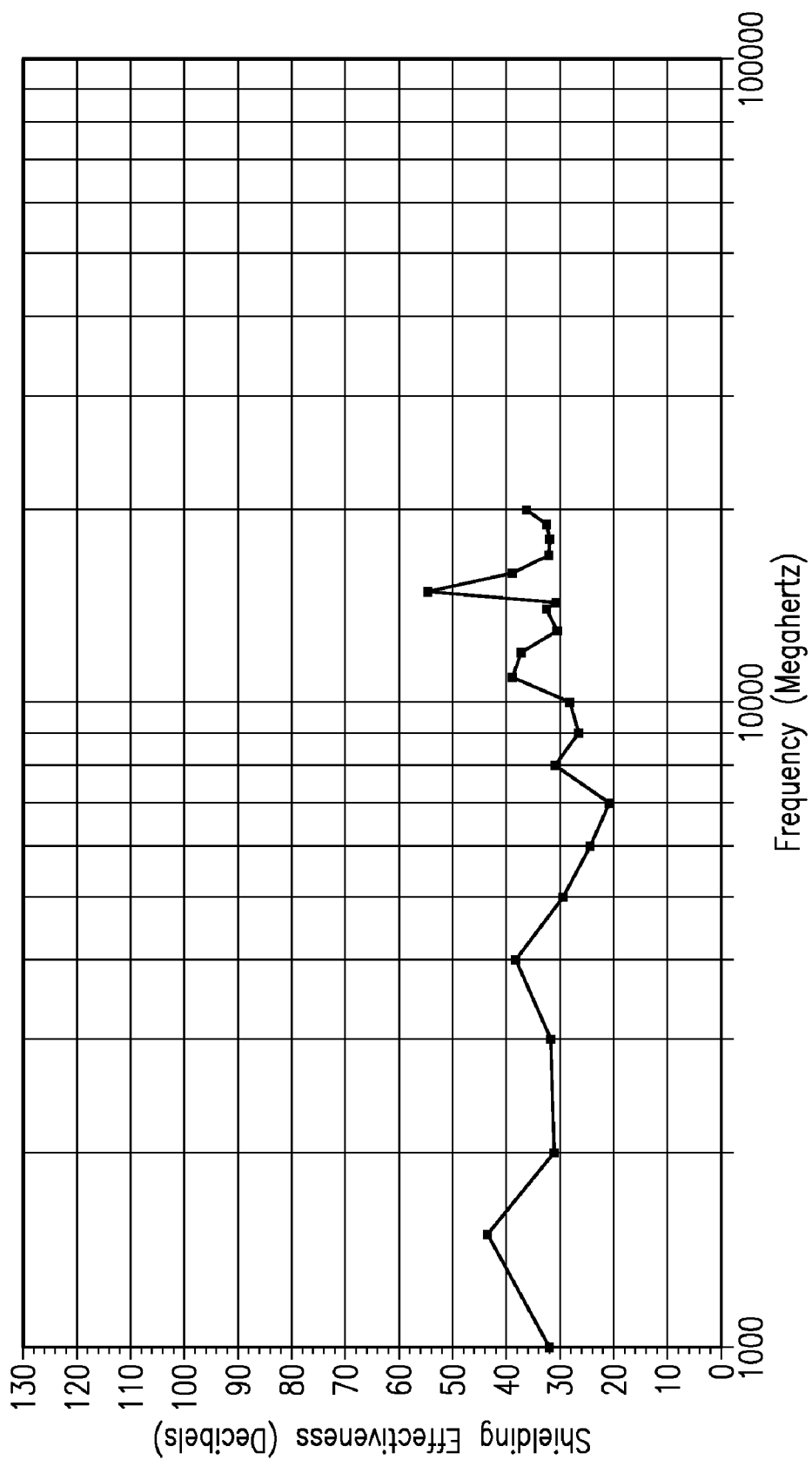
FIG. 7 is an exemplary line graph illustrating EMI shielding effectiveness (in decibels) versus frequency (in Megahertz) for an exemplary shield according to one exemplary embodiment.

In some embodiments, the shield 100 has been shown to attenuate EMI radiation by about thirty to forty decibels. Referring to FIG. 7, there is an exemplary line graph illustrating EMI shielding effectiveness (in decibels) versus frequency (in Megahertz) for the shield 100. These test results were obtained after the cover 110 was removed from the lower portion 108, and then the same cover 110 was reassembled or reattached back to the lower portion 108. This testing and results depicted in FIG. 7 are provided for purpose of illustration only and not for purposes of limitations, as other embodiments may be configured to provide different levels of attenuation and/or be used at other frequencies than what is shown in FIG. 7.

Numerical dimensions and values are provided herein for illustrative purposes only. The particular dimensions and values provided are not intended to limit the scope of the present disclosure.

Certain terminology is used herein for purposes of reference only, and thus is not intended to be limiting. For example, terms such as "upper," "lower," "above," "below," "top," "bottom," "upward," "downward," "upwardly," and "downwardly" refer to directions in the drawings to which reference is made. Terms such as "front," "back," "rear," "bottom," and "side," describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first," "second," and other such numerical terms referring to structures do not imply a sequence or order unless clearly indicated by the context.

When introducing elements or features and the exemplary embodiments, the articles "a," "an," "the," and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. An electromagnetic interference (EMI) shield having a single piece construction, comprising:
    sidewalls configured for installation to a substrate generally about one or more electrical components on the substrate;
    an upper surface integrally formed with the sidewalls;
    a snap latch mechanism integrally defined by upper and lower portions of one or more of the sidewalls for releasably attaching a cover including the upper surface and the upper sidewall portions to the lower sidewall portions, the snap latch mechanism including:
    a first interlocking member integrally defined by one or more of the upper sidewall portions, and downwardly depending relative to the upper surface;
    a second interlocking member integrally defined by one or more of the lower sidewall portions, and upwardly protruding relative to the upper surface of the cover; and
    an opening to accommodate movement of the first interlocking member inwardly relative to the opening, thereby allowing continued respective upward or downward movement of the first interlocking member relative to the second interlocking member for engaging or disengaging the snap latch mechanism;
    whereby disengagement of the snap latch mechanism allows the cover to be completely separated from the lower sidewall portions of the shield; and
    whereby the cover is reattachable to the lower sidewall portions of the shield by engagement of the snap latch mechanism.

2. The shield of claim 1, wherein the snap latch mechanism comprises a plurality of openings with a corresponding number of pairs of first interlocking members and second interlocking members, each opening disposed generally between a corresponding pair of first interlocking members, each pair of first interlocking members being disposed generally between a corresponding pair of second interlocking members.

3. The shield of claim 1, wherein the first interlocking member is configured for movement inwardly into the opening while remaining substantially within the same plane as the corresponding upper and lower sidewall portions.

4. The shield of claim 1, wherein the second interlocking member includes a camming surface such that contact with the first interlocking member causes inward movement of the first interlocking member into the opening.

5. The shield of claim 1, wherein:
    the first interlocking member comprises a protrusion having a tapered surface portion; and
    the second interlocking member comprises a cutout complementary in shape to the tapered surface portion of the first interlocking member, such that the interlocking engagement of the cutout and the tapered surface portion helps releasably retain the cover to the lower sidewall portions.

6. The shield of claim 1, wherein the lower sidewall portions comprise two or more sidewall portions separated at the corners thereof by a gap.

7. The shield of claim 1, wherein the shield is made entirely from a single blank of material.

8. The shield of claim 1, wherein a scored geometry is defined at least partially along the interface between the cover and the lower sidewall portions of the shield.

9. The shield of claim 8, wherein the scored geometry is configured for reducing effective slot length along the interface, so as to improve EMI shielding performance.

10. The shield of claim 8, wherein the scored geometry includes a plurality of upwardly and downwardly protruding portions and recesses defined generally between adjacent pairs of the respective upwardly or downwardly protruding portions for receiving the corresponding other upwardly or downwardly protruding portions.

11. The shield of claim 10, wherein the protruding portions and recesses are generally triangular in shape.

12. The shield of claim 8, wherein the scored geometry includes at least one of:
   a sawtooth tooth configuration;
   a zigzag configuration; and
   a jagged tooth configuration.

13. The shield of claim 1, wherein the first interlocking member is configured to be snap fit into engagement with the second interlocking member, such that the cover may be snap fit onto and releasably attached to the lower sidewall portions without requiring the use of a tool.

14. The shield of claim 1, wherein the first and second interlocking members are configured to be repeatedly engaged and disengaged, thereby allowing repeated removal and reattachment of the cover to/from the lower sidewall portions of the shield.

15. A shield suitable for use in providing electromagnetic interference shielding for one or more electrical components on a substrate, the shield comprising a shielding enclosure including sidewalls and an integral top surface, the sidewalls including upper and lower portions cooperatively defining an interlock therebetween, the upper sidewall portions depending downwardly from the integral top surface, the interlock releasably attaching the integral top surface and upper sidewall portions to the lower sidewall portions, whereby disengagement of the interlock allows the integral top surface and upper sidewall portions to be completely separated from the lower sidewall portions, and whereby the integral top surface and upper sidewall portions are reattachable to the lower sidewall portions by engagement of the interlock;
   a first interlocking member integrally defined by one or more of the upper sidewall portions, and downwardly depending relative to the integral top surface;
   a second interlocking member integrally defined by one or more of the lower sidewall portions, and upwardly protruding relative to the integral top surface;
   and an opening to accommodate movement of the first interlocking member inwardly relative to the opening while remaining generally within the same plane as the corresponding upper and lower sidewall portions, thereby allowing continued respective upward or downward movement of the first interlocking member relative to the second interlocking member for engaging or disengaging the interlock.

16. The shield of claim 15, wherein the interlock is configured such that the integral top surface and upper sidewall portions may be snap fit back onto the lower sidewall portions without requiring the use of a tool.

17. The shield of claim 15, wherein at least a portion of the interface between the upper and lower sidewall portions includes a scored geometry configured to reduce the effective slot length along the interface, so as to improve EMI shielding performance.

18. The shield of claim 15, wherein the shielding enclosure is made entirely from a single blank of material.

19. The shield of claim 15, wherein:
   the first interlocking member comprises a protrusion having a tapered surface portion;
   the second interlocking member comprises a cutout complementary in shape to the tapered surface portion of the first interlocking member, such that the interlocking engagement of the cutout and the tapered surface portion helps releasably retain the integral top surface and upper sidewall portions to the lower sidewall portions.

20. The shield of claim 15, wherein the lower sidewall portions comprise two or more sidewall portions separated at the corners thereof by a gap.

21. An electronic device including the shield of claim 15.

* * * * *